United States Patent [19]
Ratnakumar

[11] Patent Number: 6,114,724
[45] Date of Patent: Sep. 5, 2000

[54] NONVOLATILE SEMICONDUCTOR MEMORY CELL WITH SELECT GATE

[75] Inventor: K. Nirmal Ratnakumar, San Jose, Calif.

[73] Assignee: Cypress Semiconductor Corporation, San Jose, Calif.

[21] Appl. No.: 09/052,770

[22] Filed: Mar. 31, 1998

[51] Int. Cl.[7] .................................................. H01L 29/788
[52] U.S. Cl. ....................... 257/326; 257/314; 365/185.18
[58] Field of Search .................................... 257/314–326; 365/185.18

[56] References Cited

U.S. PATENT DOCUMENTS

| | | | |
|---|---|---|---|
| 5,197,027 | 3/1993 | Challa | 365/185 |
| 5,216,268 | 6/1993 | Chen et al. | 257/315 |
| 5,222,040 | 6/1993 | Challa | 365/185 |
| 5,297,081 | 3/1994 | Challa | 365/184 |
| 5,323,351 | 6/1994 | Challa | 365/218 |
| 5,326,999 | 7/1994 | Kim et al. | 275/315 |
| 5,357,465 | 10/1994 | Challa | 365/185 |
| 5,408,431 | 4/1995 | Challa | 365/185 |
| 5,414,658 | 5/1995 | Challa | 365/185 |
| 5,439,838 | 8/1995 | Yang | 437/43 |
| 5,471,422 | 11/1995 | Chang et al. | 365/185.26 |
| 5,508,955 | 4/1996 | Zimmer et al. | 365/185.16 |
| 5,596,529 | 1/1997 | Noda et al. | 365/185.28 |
| 5,698,879 | 12/1997 | Aritome et al. | 257/326 |
| 5,706,228 | 1/1998 | Chang et al. | 365/185.18 |
| 5,729,493 | 3/1998 | Morton | 365/185.21 |
| 5,856,691 | 1/1999 | Hazama | 257/326 |
| 5,914,514 | 6/1999 | Dejenfelt et al. | 257/322 |

OTHER PUBLICATIONS

M. Momodomi et al., "New Device Technologies for 5V–Only 4mb EEPROM with Nand Structure Cell", pp. 142–145, Reprinted from the *IEDM Tech. Dig.*, pp. 142–145, 1988.

Barcella et al., "A 70ns CMOS Double Metal 16Mbit EPROM with Hierarchical Word Line Decoder", *IEEE Nonvolatile Semiconductor Memory Workshop*, pp. 3 pgs total (Aug. 14, 1995).

John Stuart Kleine, U.S. Patent application No. 08/537,131 entitled, "Structure and Process for a Gouge–Free Stacked Non–Volatile Memory Cell with Select Gate", pp. 50 pages total, filed on Sep. 29, 1995.

Onoda et al., "A Novel Cell Structure Suitable for a 3 Volt Operation, Sector Erase Flash Memory", Apr. 1992, IEEE, pp. 24.3.1–24.3.4.

*Primary Examiner*—David Hardy
*Attorney, Agent, or Firm*—Wagner, Murabito & Hao LLP

[57] ABSTRACT

An electrically erasable programmable read only memory (EEPROM) cell including a tunnel dielectric layer formed over a semiconductor substrate. The EEPROM cell may have a floating gate transistor and a select transistor. The floating gate transistor may have a floating gate formed over the tunnel dielectric and a control gate formed over the floating gate. The select transistor may have a first gate formed over the tunnel dielectric and a second gate formed over the first gate. The second gate may be electrically connected to the first gate.

21 Claims, 17 Drawing Sheets

NONVOLATILE SEMICONDUCTOR MEMORY CELL WITH SELECT GATE

FIELD OF THE INVENTION

The present invention relates to nonvolatile memory cells, and more particularly to electrically erasable programmable read only memory (EEPROM) cells.

BACKGROUND

EEPROM cells are nonvolatile memory cells that may be electrically programmed, read, and erased. EEPROM cells typically include two transistors referred to as a floating gate transistor and a select or isolation transistor. The select transistor is typically used to select the floating gate transistor for reading or programming. The floating gate transistor may be programmed using Fowler-Nordheim tunneling to store either a positive or negative charge on its floating gate.

A cross-section of a typical conventional EEPROM cell 100 is shown in FIG. 1A. EEPROM cell 100 is formed on semiconductor substrate 102 and includes a select transistor 124 and a floating gate transistor 122. Select transistor 124 includes source region 106, drain region 108, gate oxide 112 and select gate 116. Floating gate transistor 122 includes source region 104, drain region 106 (which it shares with select gate 106), tunnel oxide 110, floating gate 118, interlayer dielectric 114, and control gate 120. Erasing of floating gate transistor 122 is typically accomplished by storing negative charge on floating gate 118. This may be accomplished by applying a large positive voltage to control gate 120 and grounding regions 104 and 106 such that electrons may tunnel through tunnel oxide 110 to floating gate 118. Programming of floating gate transistor 122 may be accomplished by applying a large positive voltage to select gate 116 (e.g., 15–20 volts), applying a large positive voltage to drain region 108, applying ground to control gate 120, and floating source region 104. In this configuration, electrons may tunnel from floating gate 118 to region 106 through tunnel dielectric 118 to create a positive charge on floating gate 118.

One disadvantage of EEPROM cell 100 is that it generally requires the formation of two different oxide thicknesses. Tunnel oxide 110 generally needs to be thin enough to enable electron tunneling (e.g., less than 125 angstroms). Gate oxide 112 is generally significantly thicker (e.g., 200 to 500 angstroms) than tunnel oxide 110 as gate oxide 112 must be able to withstand the high positive program voltages supplied to select gate 116 without breaking down. Forming two different oxide thicknesses generally increases the complexity and cost of forming EEPROM cell 100. U.S. Pat. No. 5,471,422 discloses an EEPROM cell that uses only tunnel oxide 110 in the formation of its floating gate and select gate transistors.

Another disadvantage of EEPROM cell 100 is that the size is generally large due to the high positive voltage applied to select gate 116 for programming. The high positive voltage typically requires that the channel region of select transistor 124 (i.e., between regions 106 and 108) be increased to avoid punch-through of the region. This generally negatively impacts the speed of EEPROM cell 100. The cell size may also be generally large due to the formation of control gate 120 over floating gate 118. Control gate 120 is typically formed over floating gate 118 after regions 104 and 106 are formed. Thus, lateral diffusion of regions 104 and 106 that occurs when forming layer 114 or control gate 120 may be significant and may lead to punch-through problems. The channel region between regions 104 and 106 is typically increased to reduce the likelihood of punch-through problems. Control gate 120 is also typically formed to overlap each side of floating gate 118 by a certain amount to account for alignment tolerances between layers. Due to minimum spacing requirements between features in a particular process, this also generally increases the size of EEPROM cell 100.

FIG. 1B shows EEPROM cell 100 formed in another conventional manner with tunnel oxide 110 forming a tunnel window 111 over region 106. The cell size is generally increased in FIG. 1B by forming tunnel window 111 over region 106. This is generally due to allowance of processing and lithographic alignment tolerances in forming tunnel window 111 after region 106 which tends to increase the length of region 106. Additionally, select transistor 124 typically requires additional graded source and drain junctions so as to pass high voltages, and long effective channel lengths to prevent drain to source punch through when select transistor 124 is off. This tends to increase the processing complexity and size of cell 100. A top view of FIG. 1B is shown in FIG. 1C.

FIG. 2 shows a conventional EEPROM array 200 and decoder circuitry. EEPROM array 200 includes EEPROM cells 100 and 202 each having a select gate and a floating gate as illustrated in FIG. 1. Each EEPROM cell is connected to decoder circuitry for providing the appropriate voltages for programming, erasing, or reading the cells. During programming, reading, or erasing, generally one row of EEPROM cells is selected and all other rows are deselected. Row decoders 204 and 210 may decode an address and determine which of EEPROM cells 100 or 202 may be selected for a designated operation. High voltage decoders 206 and 212 may then apply the appropriate program voltage (VPP), erase voltage (VE), or read voltage (VR) to the gates of the select transistors, and high voltage decoders 208 and 214 may apply the appropriate program voltage (VFP), erase voltage (VFE), or read voltage (VFR) to the floating gate transistors of EEPROM cells 100 and 202. The design an implementation of the decoder circuitry can be complex as voltages for the selected and deselected cells are different at the same time. Additionally, the decoder may have to simultaneously generate both positive voltages and negative voltages at the same time.

Therefore, what is needed is an EEPROM cell that is compact, can be manufactured without significant process complexity, and that may be programmed, erased, and read using less complex decoder circuitry.

SUMMARY OF THE INVENTION

One embodiment of the present invention concerns an electrically erasable programmable read only memory (EEPROM) cell including a tunnel dielectric layer formed over a semiconductor substrate. The EEPROM cell may have a floating gate transistor and a select transistor. The floating gate transistor may have a floating gate formed over the tunnel dielectric and a control gate formed over the floating gate. The select transistor may have a first gate formed over the tunnel dielectric and a second gate formed over the first gate. The second gate may be electrically connected to the first gate.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A novel EEPROM cell and methods of programming, reading, and erasing the same are disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

As will be described in more detail below, one embodiment of the present invention concerns an electrically erasable programmable read only memory (EEPROM) cell including a tunnel dielectric layer formed over a semiconductor substrate. The EEPROM cell may have a floating gate transistor and a select transistor each formed over the tunnel dielectric. This may avoid additional process steps of forming two gate oxide thicknesses. This may also generally allow for the use of low programming voltages to be supplied to the select transistor. The floating gate transistor may have a floating gate formed over the tunnel dielectric and a control gate formed over the floating gate with an interpoly dielectric separating the two gates. The select transistor may have a first gate formed over the tunnel dielectric and a second gate formed over, and electrically connected to, the first gate. The select gate and floating gate transistors may be formed from a double-poly self-aligned stacked gate technology. This may reduce complexity of forming the EEPROM cell, and may reduce the size of the EEPROM cell relative to conventional EEPROM cells. Additionally, an improved decoding scheme is disclosed that may be used to provide appropriate programming, erasing, and reading voltages to selected (and deselected) EEPROM cells in an EEPROM array.

Figure 3A:
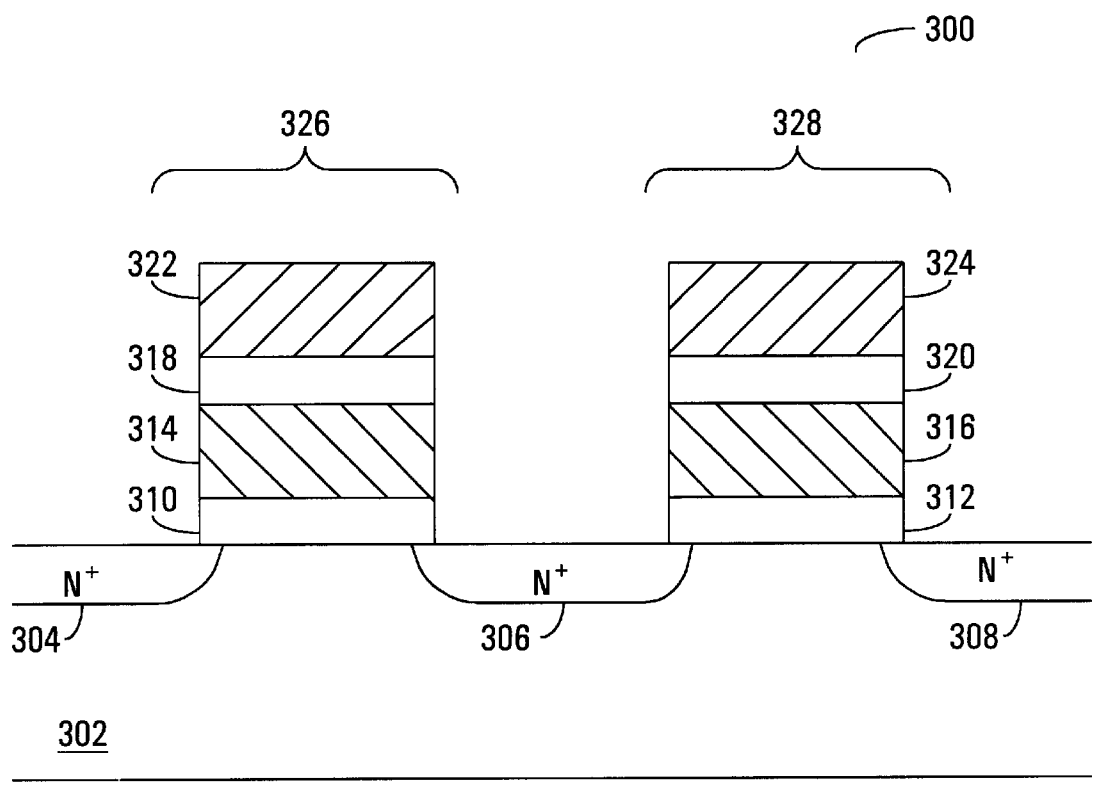
FIG. 3A is a cross-sectional view of one embodiment of a EEPROM cell according to the present invention.

FIG. 3A is a cross-sectional view of one embodiment of an EEPROM cell 300 according to the present invention. EEPROM cell 300 includes a floating gate transistor 326 and a select or isolation transistor 328 formed over semiconductor substrate 302. Semiconductor substrate 302 may be a P-type substrate. Alternatively, substrate 302 may be an N-type. Floating gate transistor 326 includes a floating gate 314 formed over a tunnel dielectric layer 310, and a control gate 322 formed over an interlayer dielectric 318. Floating gate 326 may store data for memory cell 300. Floating gate transistor 326 also includes a source region 304 and a drain region 306 each formed in substrate 302. Select gate 328 includes a first gate 316 formed over a tunnel dielectric layer 312, and a second gate 324 formed over interlayer dielectric 320. Select gate transistor 328 also includes a drain region 308, and a source region 306 that it may share with the drain of floating gate transistor 326. First gate 316 and second gate 324 may be electrically connected together (not shown in FIG. 3A) so as form one electrical gate that may be used to control access to floating gate transistor 326. Regions 304, 306, and 308 may be doped N+ regions when substrate 302 is a P-type substrate. Alternatively, regions 304, 306, and 308 may be P+ regions when substrate 302 is an N-type substrate.

Figure 3B:
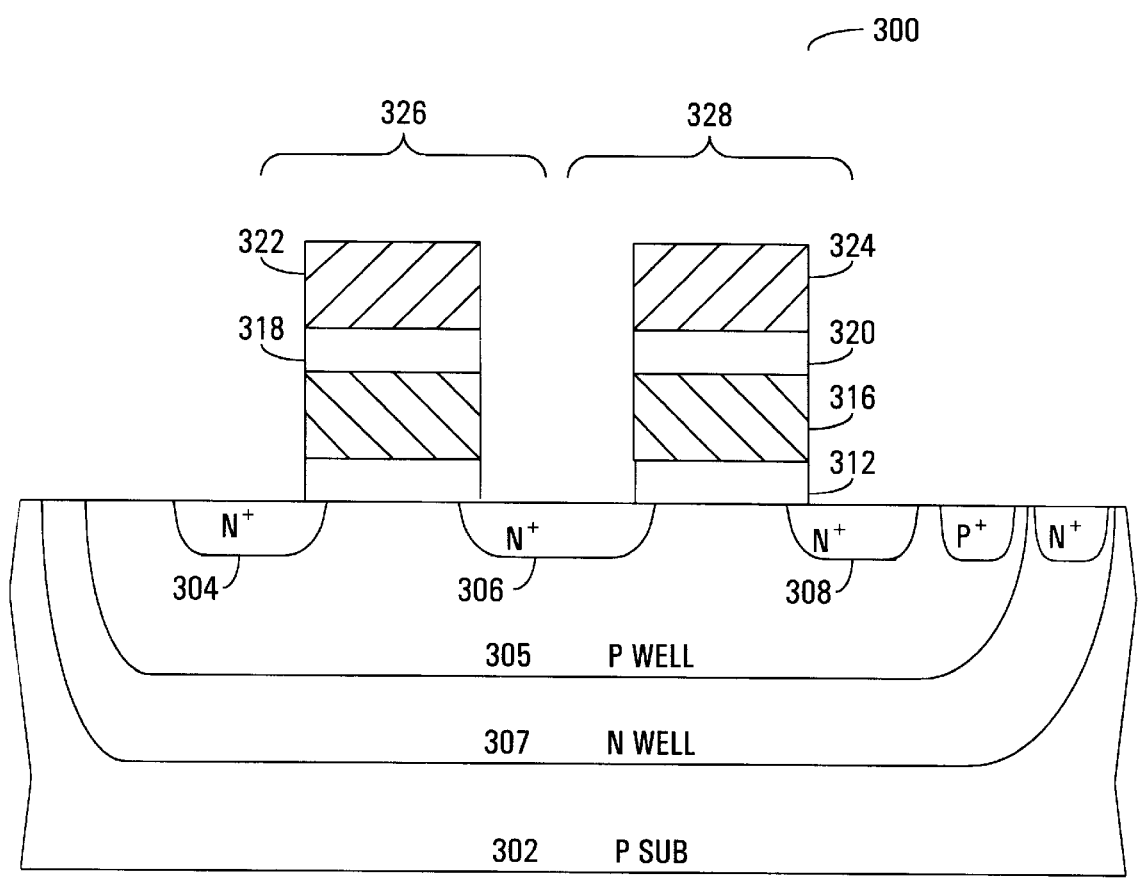
FIG. 3B is a cross-sectional view of an EEPROM cell formed in a triple-well process according to one embodiment of the present invention.

Cell 300 may be formed in a triple-well process as shown in FIG. 3B. FIG. 3B shows that substrate 302 includes N-well 307 and P-well 305. Cell 300 may be formed in P-well 305. P-well 305 may be taken to negative voltages. In an alternative embodiment, regions 304, 306, and 308 may be P-type regions, substrate 302 may be N-type, well 305 may be N-type, and well 307 may be P-type.

Figure 4:
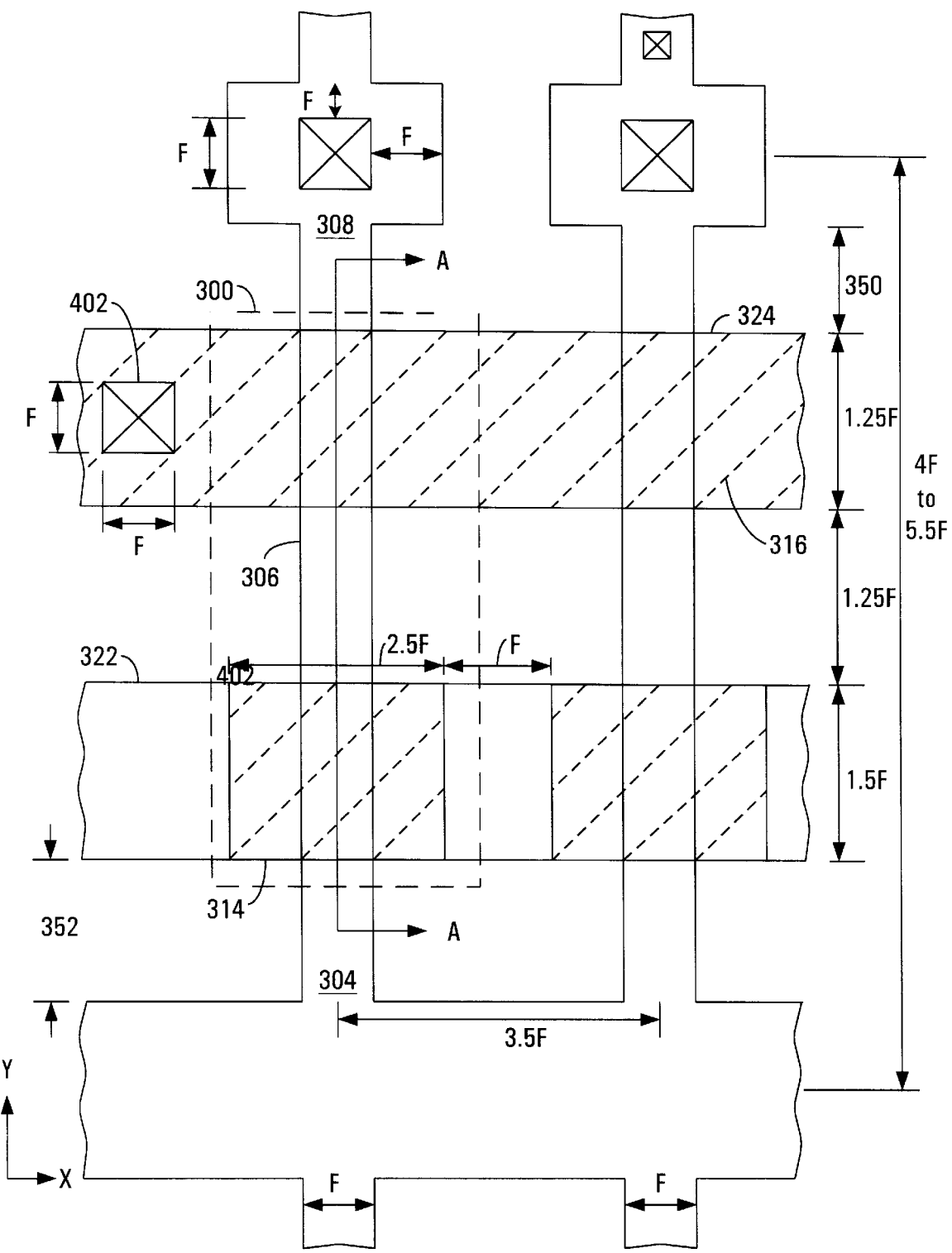
FIG. 4 is a top view of the EEPROM cell of FIG. 3A.

FIG. 4 shows a top view of an EEPROM array including EEPROM cell 300 and another EEPROM cell. The cross-sectional view of FIG. 3A is taken along A—A of FIG. 4. FIG. 4 shows first gate 316 and floating gate 314 as broken diagonal lines as first gate 316 may be covered by second gate 324. First gate 316 and second gate 324 may be electrically connected by contact 402. Contacts may be placed periodically between a number of EEPROM cells (e.g., every 16 or 32 cells) in an EEPROM array to reduce impedance mismatch between the lines, and to reduce RC delays along the lines.

Floating gate transistor 326 and select transistor 328 may be formed from a double-poly self-aligned stacked process as described below. This process may enable tunnel oxide layers 310 and 312 to be formed from the same layer of oxide, floating gate 314 and first gate 316 to be formed from the same layer of conductive material (e.g., a first polysilicon layer), and control gate 318 and second gate 324 to be formed from the same layer of conductive material (e.g., a second polysilicon layer). This may reduce the number of process steps required to form EEPROM cell 300 when compared with conventional EEPROM cells.

Tunnel dielectric layers 310 and 312 may be formed at the same time and may be of the same approximate thickness. While reducing the number of process steps, this may additionally enable lower programming voltages to be applied to gates 316 and 324. Lower programming voltages may allow for reducing the size of the EEPROM cell. The size of the EEPROM cell may be reduced because the channel regions of select gate transistor 328 (i.e., between regions 306 and 308) and/or floating gate transistor 326 (i.e., between regions 304 and 306) and may be decreased as the probability of punch-through is reduced due to lower programming voltages that may be required on the bit line coupled to the select transistor. For example, the channel regions may be the minimum geometry allowed by a given process less any lateral diffusion or junction grading. For one embodiment, minimum feature size may be from approximately 0.1 microns ($\mu$m) to approximately 1.0 $\mu$m.

Figure 5:
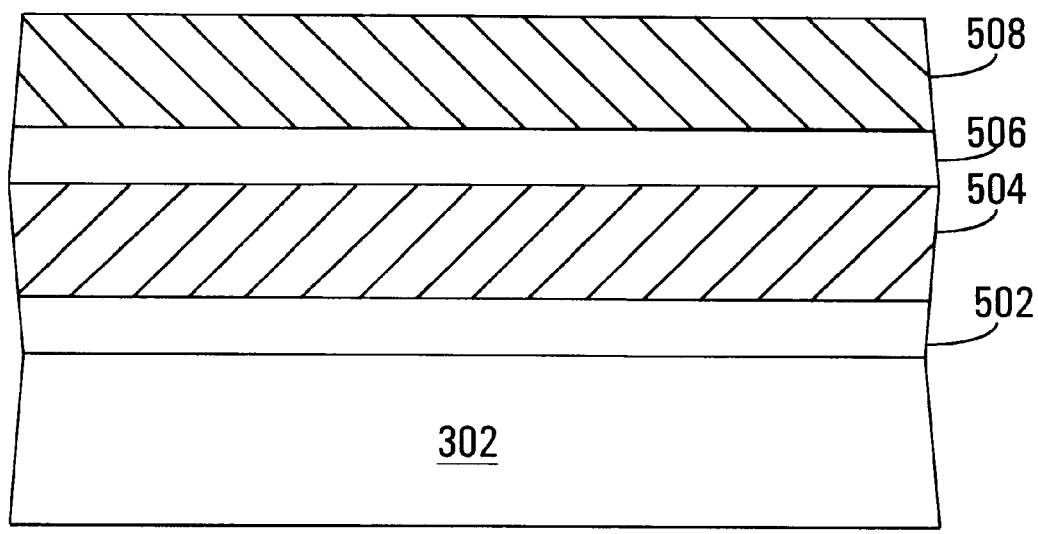
FIGS. 5–7 are cross-sectional views of one method of forming the EEPROM cell of FIG. 3A.

FIGS. 5–11 show one method of forming EEPROM cell 300 according to the present invention. Other methods may be used to form EEPROM cell 300. As shown in FIG. 5, a tunnel dielectric layer may be formed over semiconductor substrate 302. Tunnel dielectric layer 502 may be grown or deposited by any process generally known for such formation. For example, tunnel dielectric layer 502 may be thermally grown from a silicon substrate 302. Tunnel dielectric layer 502 may be formed from any dielectric material(s) suitable for use as a tunnel dielectric (e.g., silicon dioxide). Tunnel dielectric layer 502 may be any thickness that enables electron tunneling with appropriate voltage ranges described below. Preferably, tunnel dielectric layer 502 is less than 150 Å, and more preferably less than 100 Å.

A first layer of conductive material 504 may then be formed over tunnel dielectric layer 502. First conductive layer 504 may include any conductive material(s). For one embodiment, first conductive layer 504 may be polysilicon. An interlayer dielectric material 506 may then be formed over first conductive layer 504. Interlayer dielectric material 506 may be grown or deposited by any process generally known for formation of interlayer dielectric materials. For one embodiment, interlayer dielectric layer 506 may be silicon dioxide. For another embodiment, interlayer dielectric 506 may formed from a several layers of dielectric or insulating materials. For example, interlayer dielectric material 506 may include a first layer of oxide, a layer of nitride, and a second layer of oxide. Interlayer dielectric material 506 may be any thickness. Preferably interlayer dielectric 506 has a thickness from approximately 100 Å to approximately 300 Å. A second layer of conductive material 508 may then be formed over interlayer dielectric material 506. Second conductive layer 508 may include any conductive material(s). For one embodiment, second conductive layer 508 may be a second layer of polysilicon or a stack of silicide on top of polysilicon (polycide).

Figure 6:
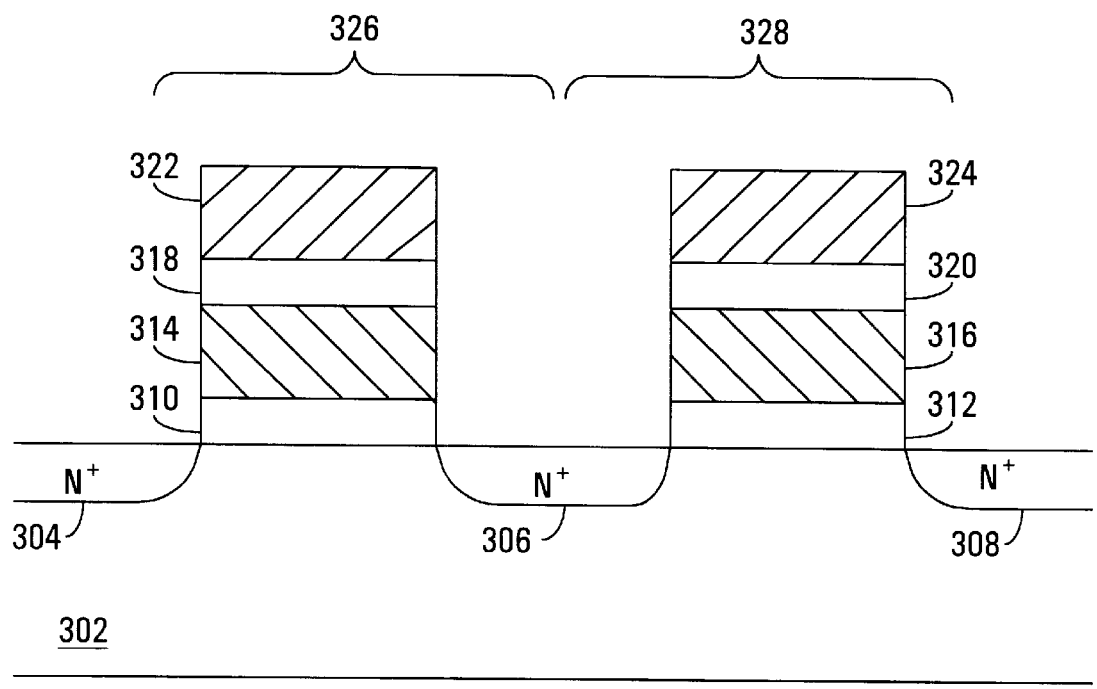
Figure 7:
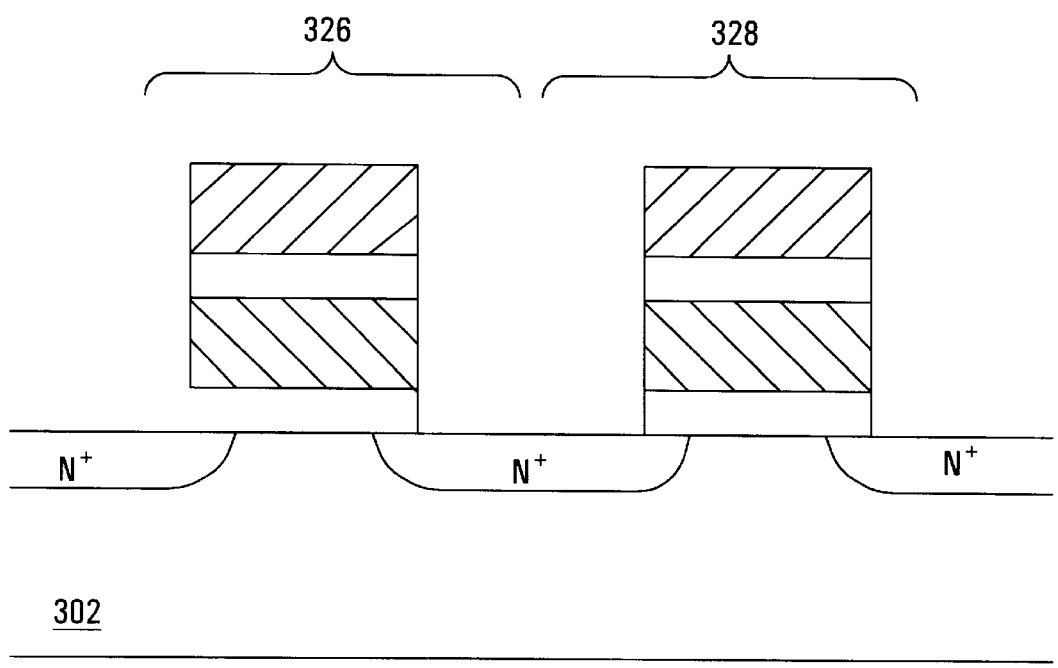

As shown in FIG. 6, layers 502, 504, 506, and 508 may be patterned to form two self-aligned stacks corresponding to floating gate transistor 326 and select transistor 328. The patterning process may be any conventional lithography process, or any other process for selectively removing regions of layers 504, 506, 508, and/or 502 to create the stacks illustrated in FIG. 6. For example, photoresist may be deposited over second conductive layer 508 and selectively exposed to light or radiation and developed to create a mask over those portions that may subsequently form control gate 322 and second gate 324. The regions surrounding the stacks may then be etched and the photoresist removed from control gate 322 and second gate 324. Doped regions 304, 306, and 308 may then be formed by ion implantation or other known doping techniques. Regions 304, 306, and 308 may include any suitable type of N-type doping material including phosphorus, arsenic, and the like. Additionally, and/or alternatively, region 306 (and/or regions 304 and 308) may be formed as graded junctions to reduce the electric field between region 302 and region 306. A graded junction may be formed by forming a region of N– doping material in addition to forming the N+ material in region 306. The N– dopant may be Phosphorus which may be implanted at an angle to place it in front of the N+ material which may be Arsenic. Junction grading can also result from a high temperature drive step since Phosphorous typically diffuses faster and ahead of Arsenic. A graded junction may further reduce the channel region under tunnel dielectric layer 310 which may result in increased speed and reduced current flow into substrate 302. Additionally, the angle of implantation for implanting the N+ material into region 306 (and/or regions 304 and 308) may be controlled so as to control the amount of lateral diffusion of region 306 (and/or regions 304 and 308) that occur due to subsequent process steps. FIG. 7 shows EEPROM cell 300 after regions 304, 406, and 308 have laterally diffused due to subsequent process steps. The lateral diffusion may further reduce the channel regions underlying the stacks.

Figure 8:
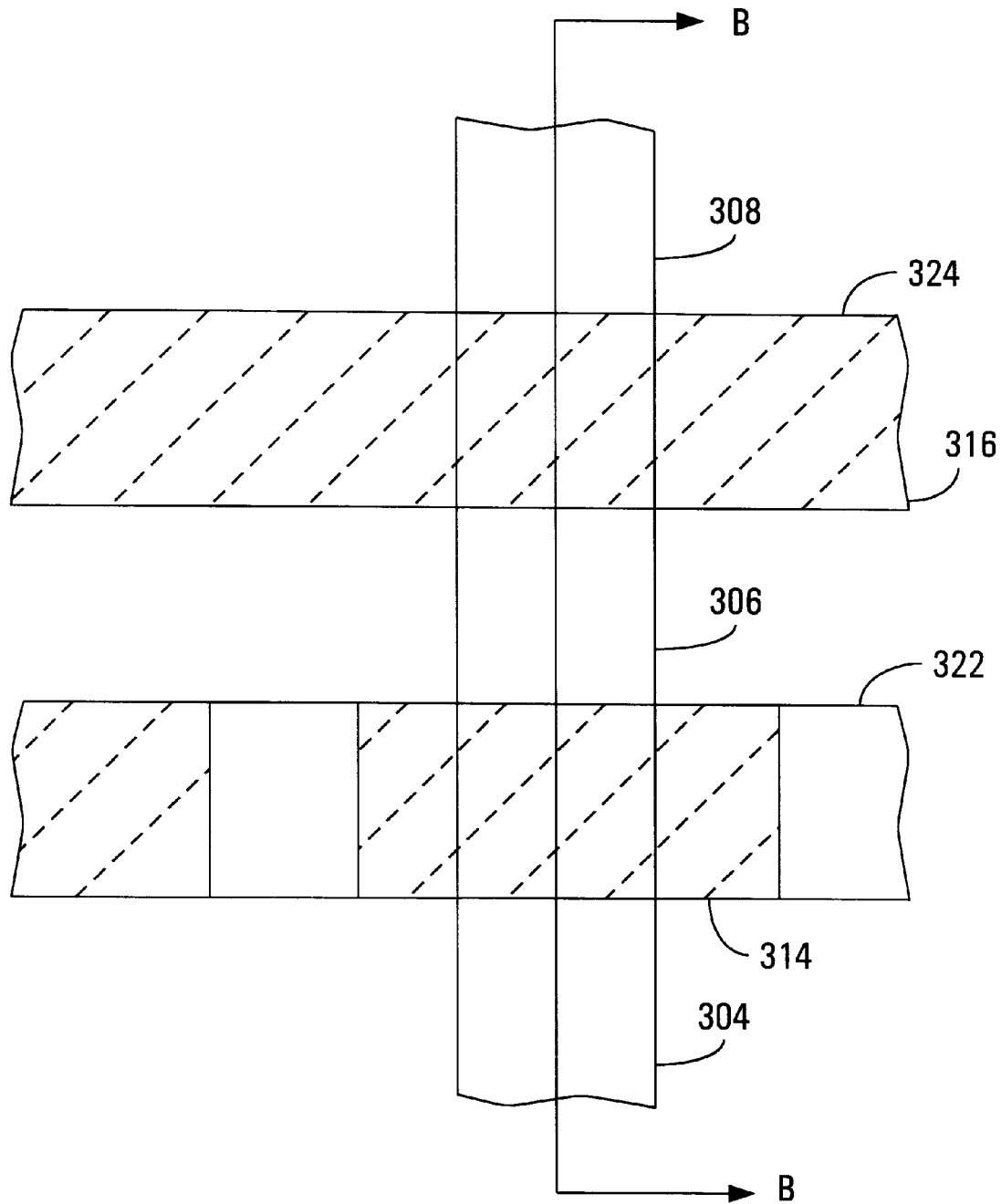
FIG. 8 is a top view of the EEPROM cell of FIG. 7.

FIG. 8 is a top view of the EEPROM cell formed in FIGS. 6 and 7. The cross-sectional views of FIGS. 6 and 7 are taken along line B—B of FIG. 8. Control gate 322 is shown overlying floating gate 314, and second gate 324 is shown overlying first gate 316. First gate 316 and floating gate 314 are shown as broken diagonal lines.

Figure 9:
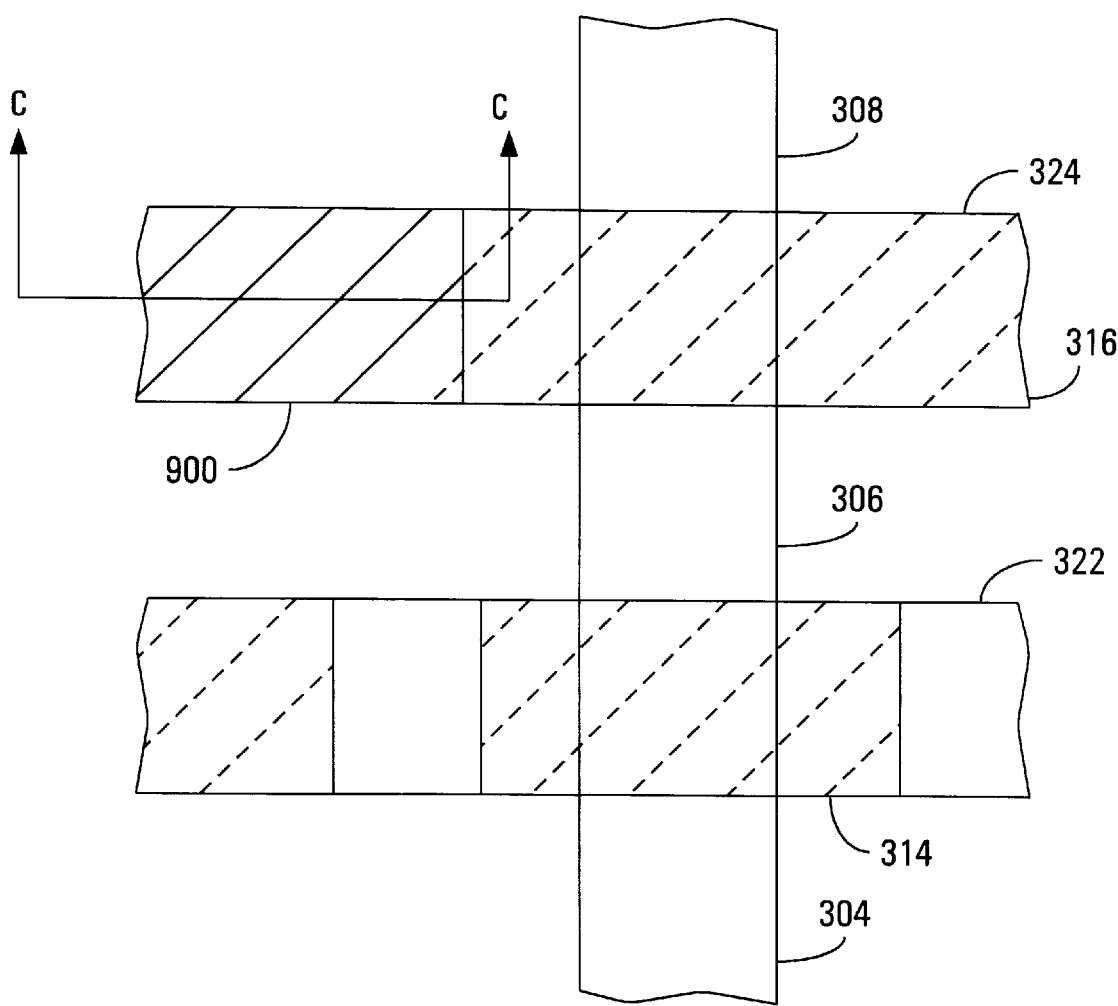
FIG. 9 is a top view of the EEPROM cell of FIG. 7 with a portion of the first gate layer of the select transistor removed.
Figure 10:
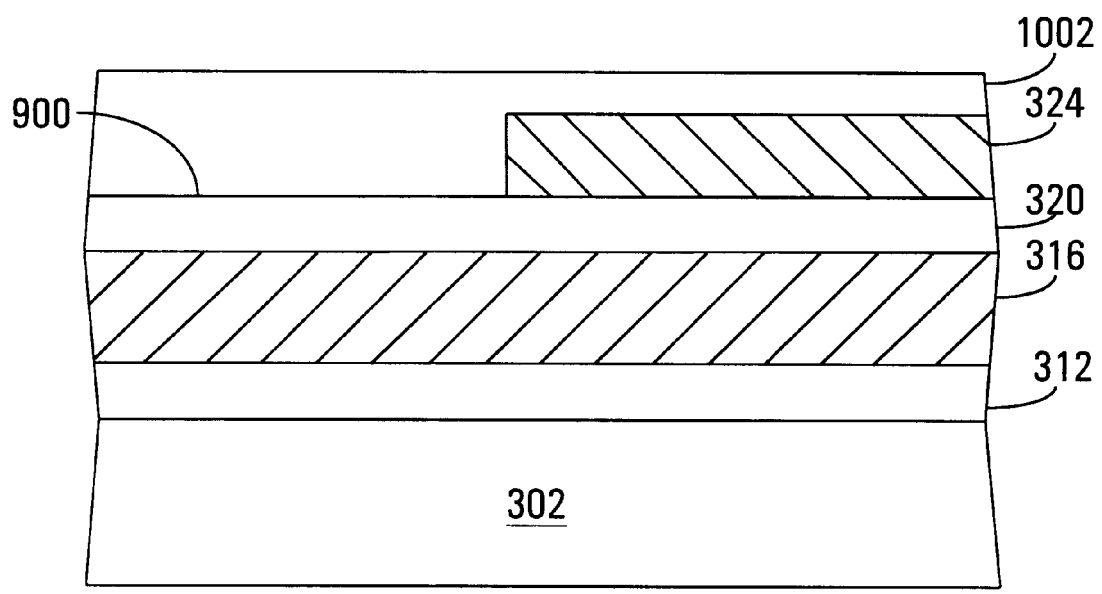
FIGS. 10–11 are cross-sectional views of one method of forming a contact between the first gate layer and the second gate layer of the select transistor.
Figure 11:
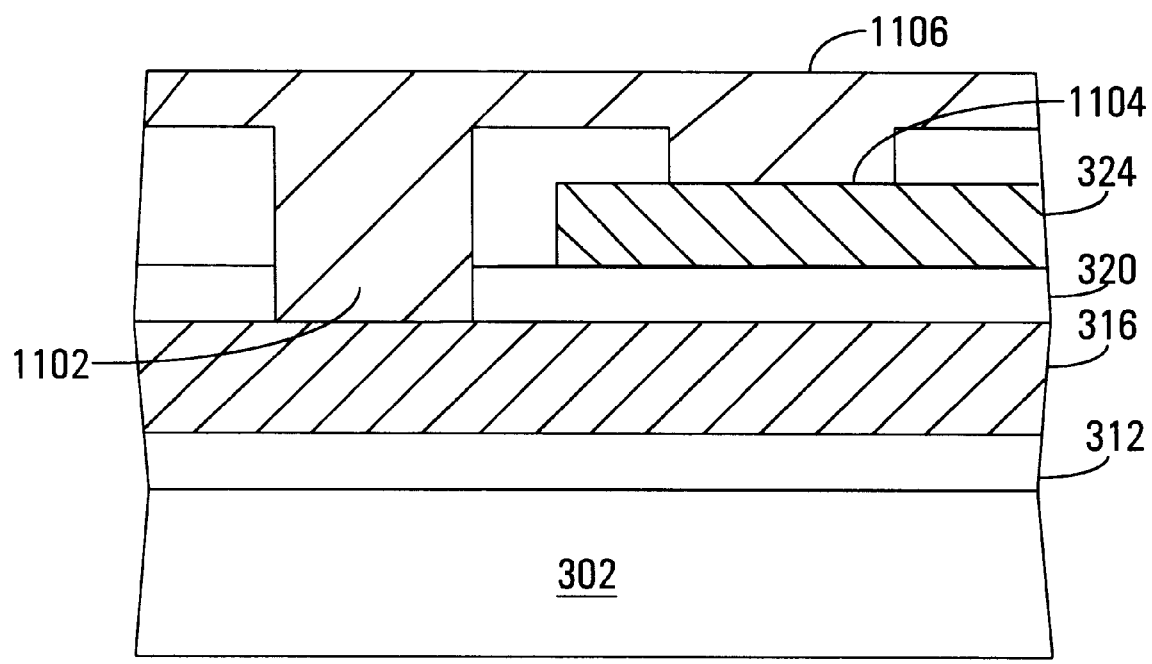

FIGS. 9–11 show one method of forming an electrical contact between first gate 316 and second gate 324 of select transistor 328. The first and second gates should be electrically connected such that select gate transistor 328 does not function as a floating gate transistor. FIG. 9 shows that second gate 324 and interlayer dielectric 320 may be patterned to expose a region 900 of first gate 316. This may be accomplished using any conventional method of selectively removing portions of second gate 324 and interlayer dielectric 320 (e.g., any suitable photolithography method). FIG. 10 shows a cross-sectional view of FIG. 9 taken along line C—C. A dielectric or insulating layer 1002 may then be formed over region 900 and second gate 324. Layer 1002 may be any suitable dielectric or insulating layer formed in any suitable manner to any suitable thickness for the later formation of an electrical contact as shown in FIG. 11. For one embodiment, layer 1002 may include silicon dioxide. For another embodiment, layer 1002 may include Borophosphosilicate glass (BPSG). Layer 1002 may then be patterned to form regions 1102 and 1104 and expose portions of first gate 316 and second gate 324 as shown in FIG. 11. This may be accomplished using any conventional method of selectively removing portions of layer 1002 (e.g., any suitable photolithography method). A third conductive layer 1106 may then be formed to contact first gate 316 and second gate 324 in regions 1102 and 1104. Third conductive layer 1106 may be any conductive layer(s) for forming a contact between gates 316 and 324. For one embodiment, conductive layer 1106 is a metal layer including copper, aluminum, gold, tungsten, and/or titanium. For another embodiment, layer 1106 is a doped polysilicon layer. Layer 1106 may then patterned such that only regions 1102 and 104 remain in direct electrical contact. The contact formed by layer 1106 may be contact 402 shown in FIG. 4.

Control gate 322 may be formed to be narrower than conventional control gates. The same patterning step used to form control gate 322 may be used to define floating gate 314 by etching the stack formed by layers 322, 318, and 314. Thus, as opposed to conventional fabrication techniques, control gate 322 does not need to extend beyond the length of floating gate 314 to account for alignment tolerances. The select gate layers 324, 320, and 316 are also defined by self-aligned stack etch during the same patterning step.

With respect again to FIG. 4, one embodiment of the geometry of the cell features is illustrated. For example, if a minimum feature size is F $\mu$m, then contact 402 may be approximately F×F $\mu$m$^2$, the length of second gate 324, interlayer dielectric 320, first gate 312, and tunnel dielectric 312 may be approximately 1.25 F, the length of control gate 322, interlayer dielectric 318, floating gate 314 and tunnel dielectric 310 may be approximately 1.5 F, the spacing between the two stacks of transistors may be approximately 1.25 F, and the length of floating gate 314 may be approximately 2.5 F to give a high control gate to floating gate coupling ratio. For this embodiment, with a feature size of 0.4 μm, the cell size of EEPROM cell 300 may be from approximately 15 to 20 $F^2$ or approximately 2.5 to 3.5 $\mu m^2$. For alternative embodiments, other feature sizes, line widths and lengths, contact sizes, and line spacing may be used.

In the length (Y) direction, the overall cell length may be reduced by using self-aligned contacts. For example, the overall cell length may be reduced from approximately 5.5 F to approximately 4 F by using self-aligned contacts such that dimensions 350 and 352 may be approximately zero.

Figure 12:
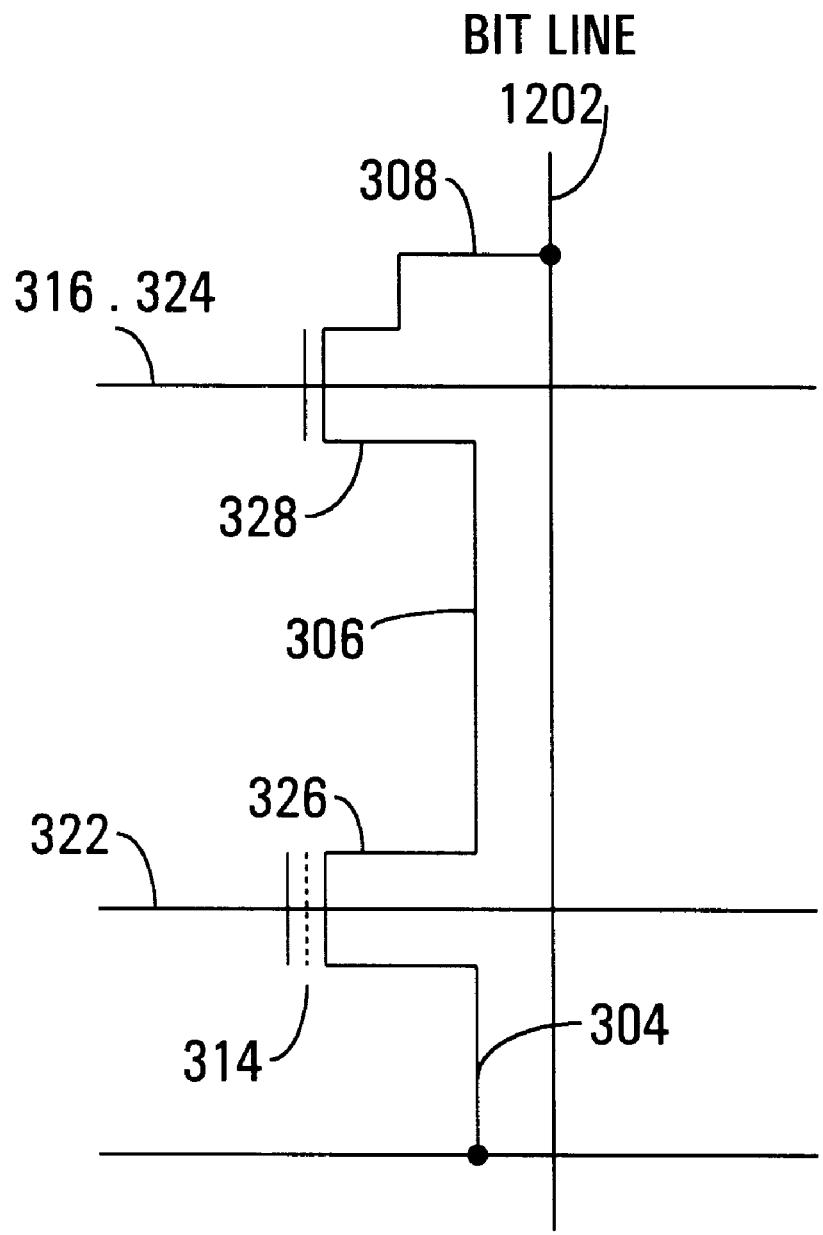
FIG. 12 is a circuit diagram of one embodiment of the EEPROM cell of FIG. 3A.

A schematic representation of EEPROM 300 is illustrated in FIG. 12 in which drain region 308 is coupled to bit line 1202. EEPROM cell 300 may be programmed using programming voltages on the second and first gate of select transistor 328 that may be generally lower than those used by conventional EEPROM cells. This is due to the negative voltage applied to control gate 322 which consequently requires a smaller positive voltage on section 306. Programming and erasing of EEPROM cell 300 may be accomplished using Fowler-Nordheim tunneling as summarized in Table 1 below.

TABLE 1

| Operation | 308 | 324, 316 | 306 | 322 | 304 |
|---|---|---|---|---|---|
| Erase Scheme A | 0 V | >1 V | 0 V | 15 to 18 V | 0 V or Float |
| Erase Scheme B | −4 to −8 V | 0 V | −4 to −8 V | 7 to 14 V | Float |
| Program | 3 to 5.5 V | 4 to 7.0 V | 3 to 5.5 V | −7 to −12 V | Float |
| Read | 1 to 2 V | 2 to 6 V | 1 to 2 V | 2 to 5 V | 0 V |

Erasing a state stored on floating gate 314 may be accomplished by applying appropriate voltages to the terminals of floating gate transistor 326 such that floating gate 314 is at a much more positive potential compared to the inversion layer linking regions 306 and 304 formed due to the positive potential on layer 314. For example, select gate transistor 328 passes a zero or negative potential on 308 by applying a suitable bias on gate 316. Floating gate 314 may then be erased using Fowler-Nordheim tunneling by applying approximately 0 volts to region 304 (or allowing it to float), and approximately 15 to 18 volts to control gate 322. A high electric field may then be created across tunnel dielectric layer 310 such that electrons may flow from the channel region, region 306, and region 304, to floating gate 314. To reduce the positive voltage on control gate 322, a negative voltage may be applied to regions 308 and 302 as shown in Erase Scheme B in Table 1. Erase Scheme B may be used, for example, in a cell formed by the triple-well process shown in FIG. 3B. One or more EEPROM cells may be erased at the same time. It may take approximately 1 to 10 milliseconds (ms) to perform an erase function. This time may be amortized over the number or EEPROM cells that may be erased at one time.

Programming data or charge onto floating gate 314 may be accomplished by enabling select gate transistor 328 and applying appropriate voltages to the terminals of floating gate transistor 326. Select gate transistor 328 may be enabled by applying and approximately 4 to 7.0 volts on gates 324 and 316. Approximately 3 to 5.5 volts may then be applied to region 308 (bit line 1202) such that approximately 3 to 5.5 volts may be present at region 306. This range of voltages is significantly reduced relative to the higher voltages generally used by conventional EEPROM cells. Floating gate 314 may then be programmed using Fowler-Nordheim tunneling by floating region 304 and applying approximately −7 to −12 volts to control gate 314. A high electric field may then be created across tunnel dielectric layer 310 such that electrons may flow from floating gate 314 to drain region 306. One or more EEPROM cells (e.g., in the same row) may be programmed at the same time. It may take approximately 1 to 10 milliseconds (ms) to perform a program function. This time may be amortized over the number or EEPROM cells that may be programmed at one time.

EEPROM cell may be programmed using a small amount of current and a small amount of power. For one embodiment, EEPROM cell 300 may require from approximately 10 nanoamperes (nA) of current to program EEPROM cell 300. Most of this current may flow from region 306 to region 302 due to band-to-band tunneling caused by high vertical fields on the tunnel dielectric. If the operating power supply is approximately 3 to 5 volts, then it may require approximately 30 nanoWatts (nW) to 50 nW to program EEPROM cell 300. The low programming current may be a result of the electron injection efficiency (i.e., the ratio of gate current to drain current injected into drain region 306) of using Fowler-Nordheim tunneling as opposed to other programming techniques such as hot electron injection. For one embodiment, the electron injection efficiency may be approximately $10^{-3}$ to $10^{-4}$.

Reading a state stored by floating gate 314 may be accomplished by enabling select gate transistor 328 and applying appropriate voltages to the terminals of floating gate transistor 326. Select gate transistor 328 may be enabled by applying approximately 2 to 5 volts on gates 324 and 316. Floating gate transistor 326 may then be biased such that approximately 0 volts are applied to region 304 and approximately 2 to 6 volts are applied to control gate 322. A voltage of approximately 1 to 2 volts may then be applied to region 308 (bit line 1202) and the state of floating gate transistor 326 sensed from bit line 1202.

Figure 13:
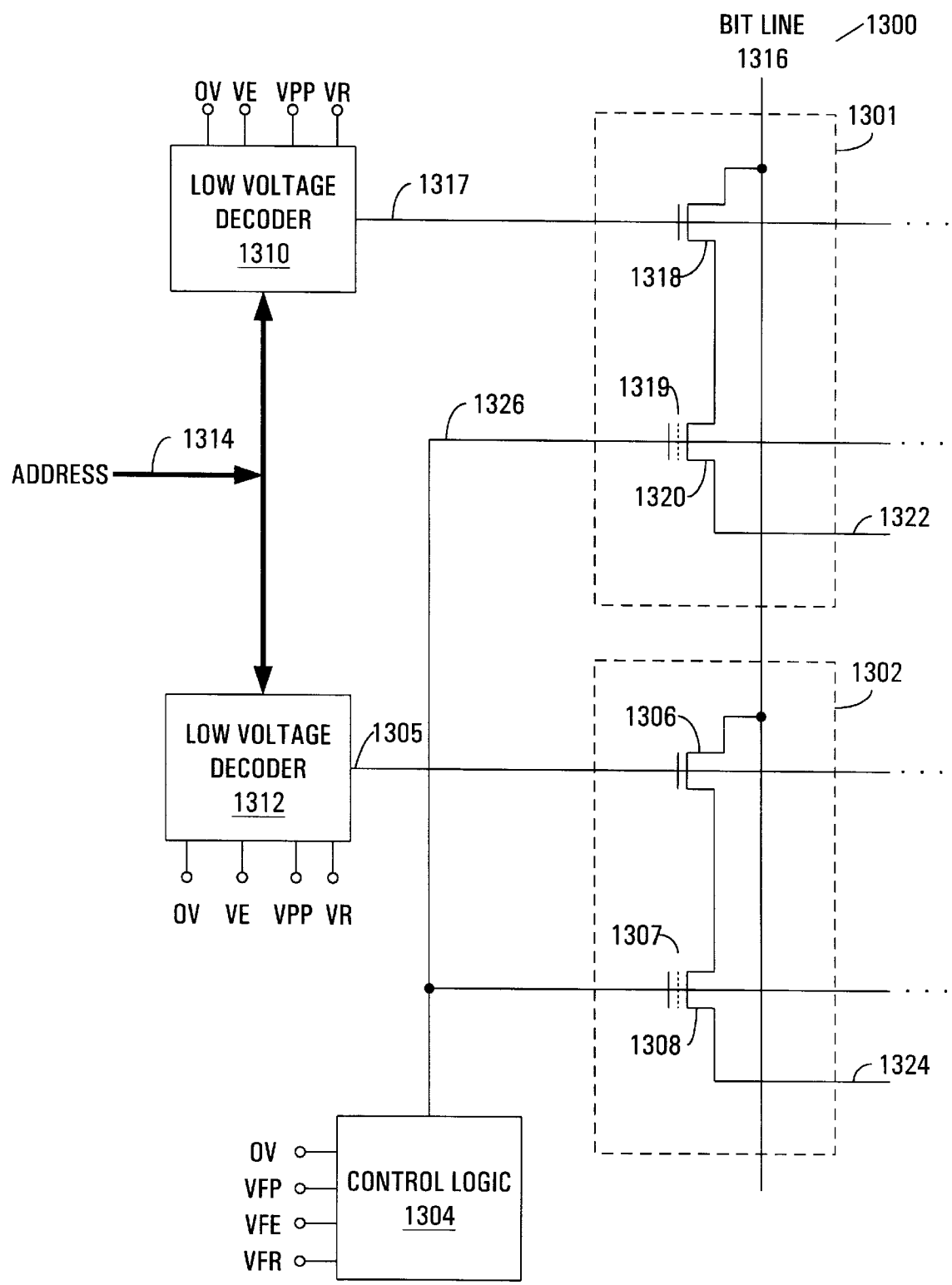
FIG. 13 is a circuit diagram of one embodiment of an EEPROM cell array including decoder circuitry according to the present invention.

FIG. 13 is a circuit diagram of one embodiment of an EEPROM cell array 1300 and circuitry for programming, erasing, and reading EEPROM cells in the array. EEPROM cell array 1300 may include EEPROM cells 1301 and 1302. EEPROM cells 1301 and 1302 may be formed in the same fashion as EEPROM cell 300 of FIG. 3A. For alternative embodiments, EEPROM cells 1301 and 1302 may be any other type of EEPROM cell. EEPROM cell 1301 may include a select transistor 1318 and floating gate transistor 1320. Select transistor 1318 may have a drain coupled to bit line 1316, a gate coupled low voltage decoder 1310, and a source coupled to the drain of floating gate transistor 1320. The gate of select transistor 1318 may be formed from two layers of conductive gate material as in EEPROM cell 300 of FIG. 3A. Floating gate transistor 1320 may include a control gate coupled control logic 1304 via line 1326, a floating gate 1319, and a source coupled to line 1322. EEPROM cell 1302 may include a select transistor 1306 and floating gate transistor 1308. Select transistor 1306 may have the drain coupled to bit line 1316, a gate coupled low voltage decoder 1312, and a source coupled to a drain of floating gate transistor 1308. The gate of select transistor 1306 may be formed from two layers of conductive gate material as in EEPROM cell 300 of FIG. 3A. Floating gate transistor 1308 may include a control gate coupled control logic 1304 via line 1326, a floating gate 1307, and a source coupled to line 1324. EEPROM cells 1301 and 1302 may be two of any number of EEPROM cells that may have their drain regions of their select transistors coupled to bit line 1316. Additionally, cell 1301 may be included in a row of EEPROM cells each having the gate terminal of their select gates coupled to word line 1317 and low voltage decoder 1310, and each having their control gate of their floating gate transistor coupled to line 1326. Similarly, cell 1301 may be included in a row of EEPROM cells each having the gate terminal of their select gates coupled to word line 1305 and low voltage decoder 1312, and each having their control gate of their floating gate transistor coupled to line 1326.

In response to an address on address bus 1314, low voltage decoders 1310 and 1312 may deselect or select EEPROM cells 1301 and 1302 for programming, erasing, or reading. Low voltage decoder 1310 may enable/disable EEPROM cell 1301 by enabling/disabling select transistor 1318. Similarly, low voltage decoder 1312 may enable/disable EEPROM cell 1302 by enabling/disabling select transistor 1306. When an EEPROM cell is selected, low voltage decoders 1310 and 1312 may appropriately provide erase voltage VE (e.g., approximately 1 volt or more), read voltage VR (e.g., approximately 2 to approximately 6 volts), or program voltage VPP (e.g., approximately 4 to approximately 7 volts) to the gates of select transistors 1318 and 1306, respectively.

Control logic 1304 may also provide the appropriate deselect voltage (e.g., approximately 0 volts), erase voltage VFE (e.g., approximately 7 to approximately 18 volts), read voltage VFR (e.g., approximately 2 to approximately 6 volts), or program voltage VFP (e.g., approximately −7 to approximately −12 volts) to line 1326. Control logic 1304 may also provide an appropriate voltage to source lines 1322 and 1324 (which may be coupled together) depending on whether EEPROM cell 1301 or 1302 is selected for programming (e.g., source line floating), erasing (e.g. source line floating or grounded), or reading (e.g., source line approximately 0 volts). Control logic 1304 may include logic or circuitry necessary to generate or supply the appropriate voltage in response to the selected program, erase, or read operation. For one embodiment, control logic 1304 may include a multiple-voltage generator.

Figure 1A:
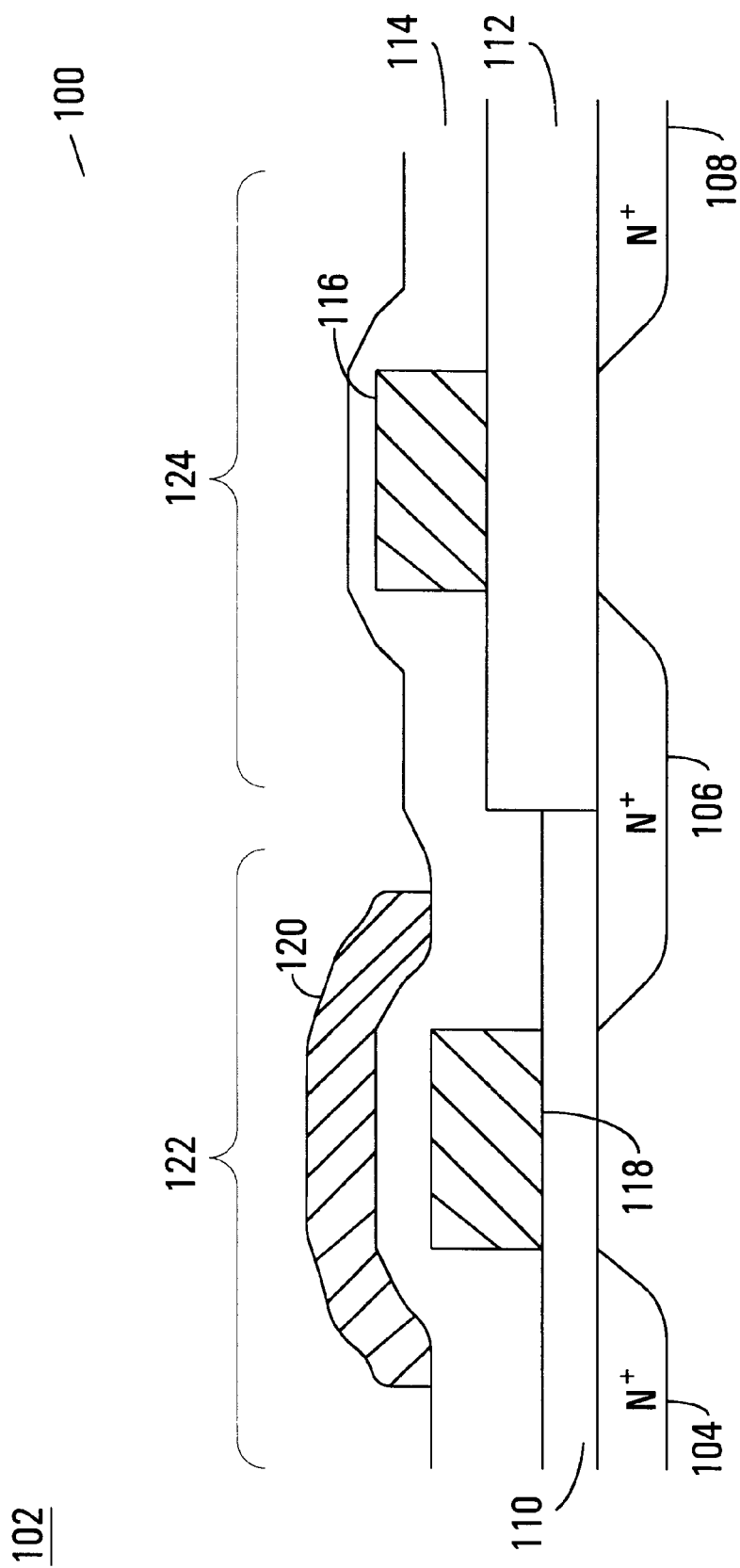
FIG. 1A is a cross-sectional view of a conventional two-transistor EEPROM cell.
Figure 1B:
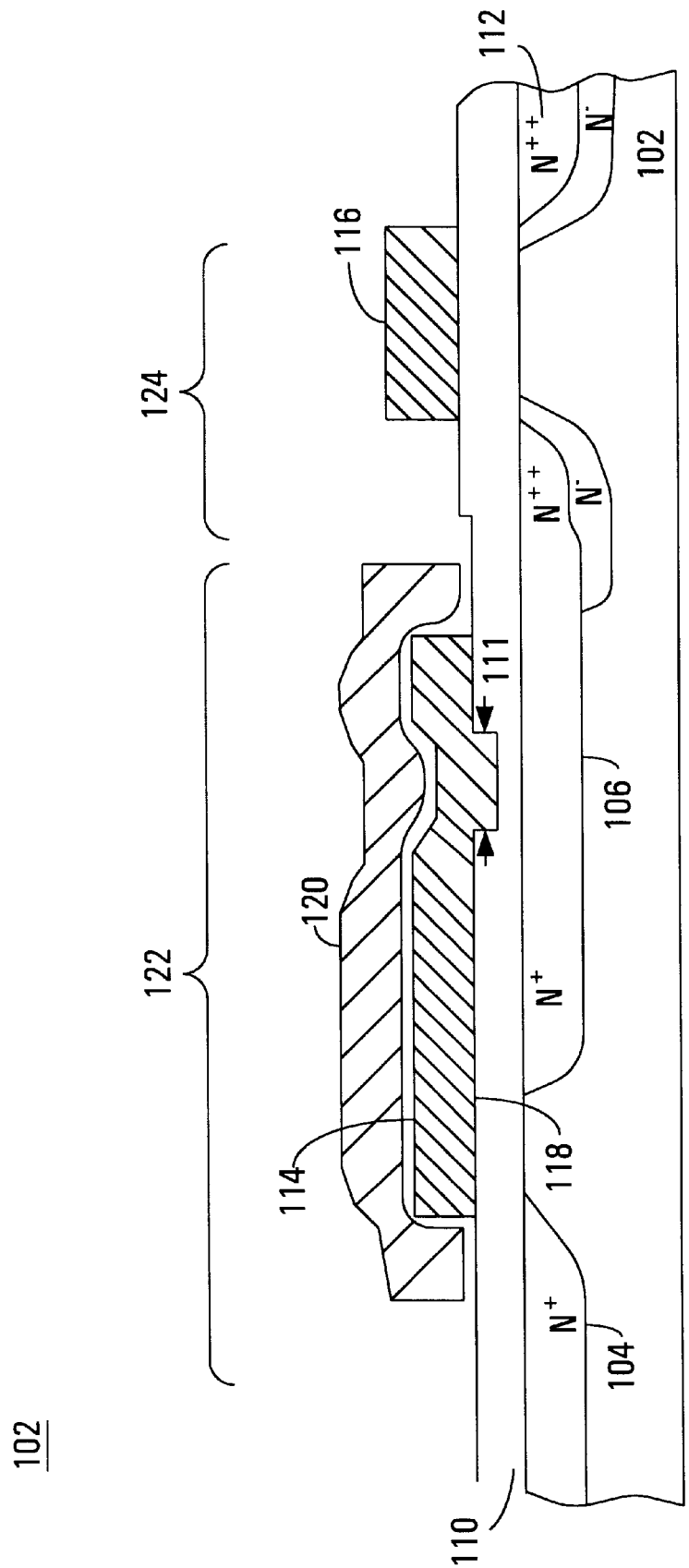
FIG. 1B is a cross-sectional view of another conventional two-transistor EEPROM cell.
Figure 1C:
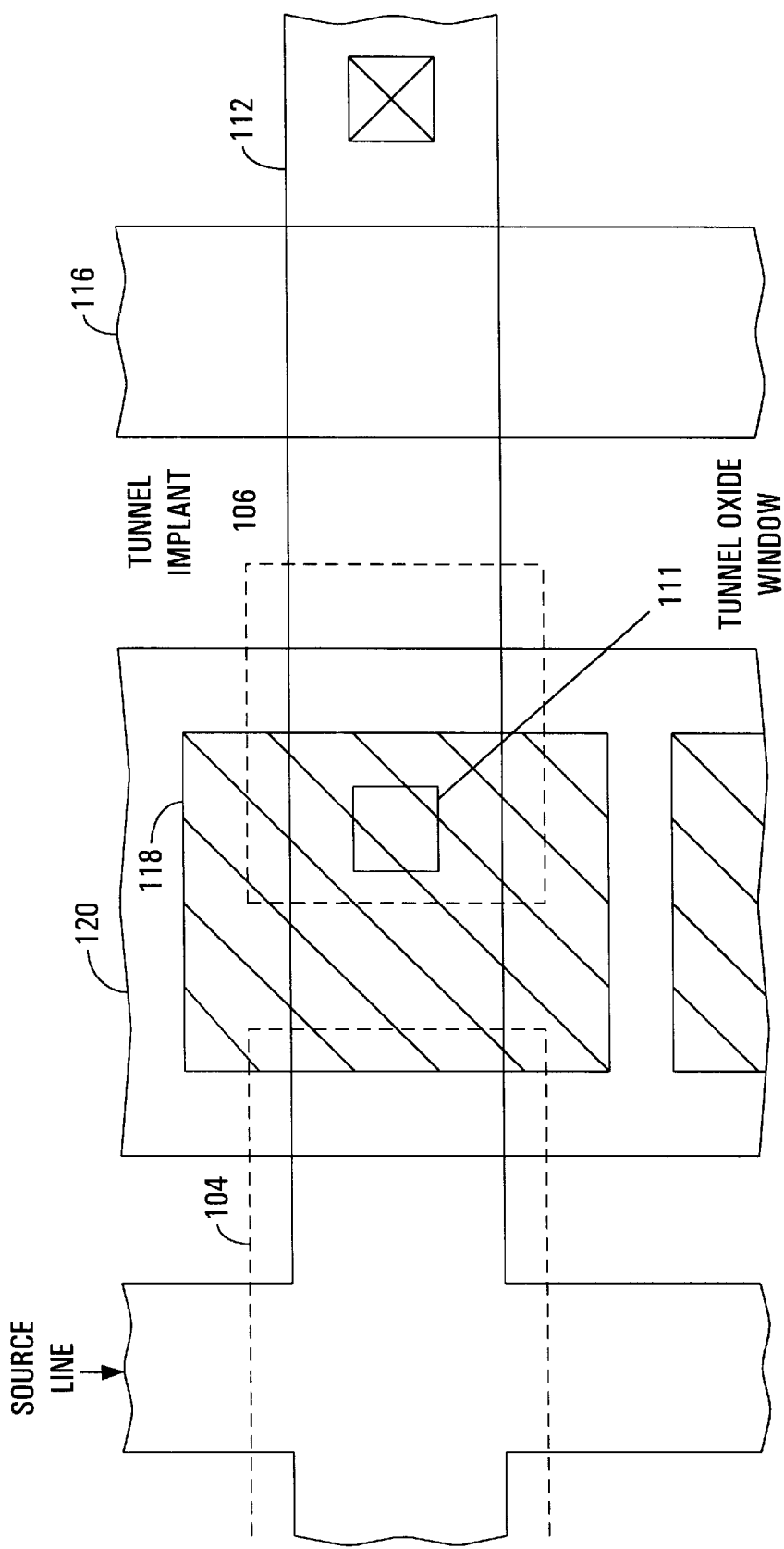
FIG. 1C is a top view of the EEPROM cell of FIG. 1B.
Figure 2:
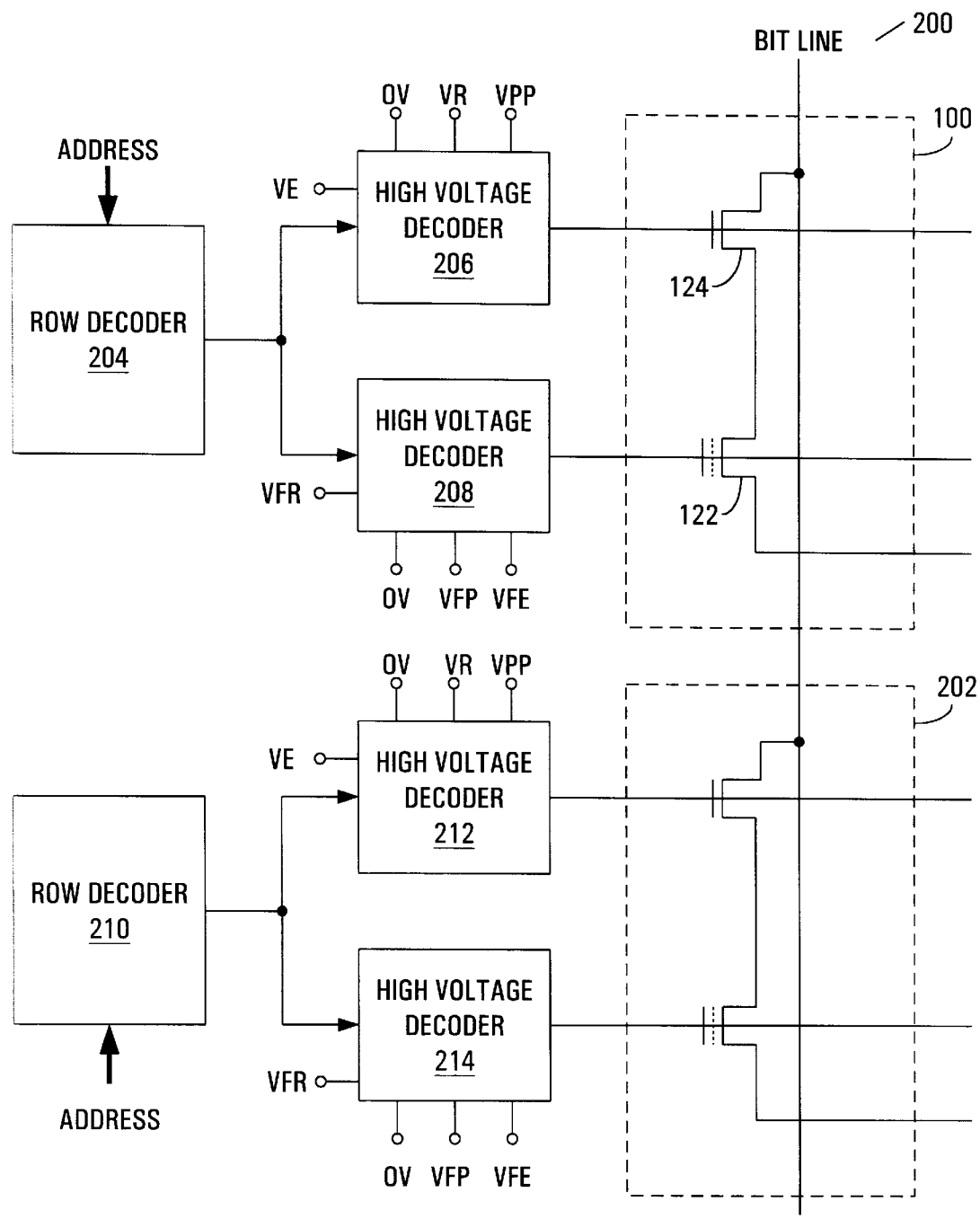
FIG. 2 is circuit diagram of a conventional EEPROM array with decoder circuitry.

Typically, either EEPROM cell 1301 or 1302 is selected for a given program or read operation. In a conventional EEPROM array such as EEPROM array 200 of FIG. 2, the decoder circuitry generates a first voltage (e.g., VR, VPP, or VE) for the selected floating gate transistor, and simultaneously generates a second different voltage (e.g., 0 volts) for the deselected floating gate transistor. In addition, different voltages are generally generated for the enabled and disabled select transistors. This generally complicates the design of the decoder circuitry. The complexity may be further complicated if negative and positive voltages are simultaneously generated.

The decoder circuitry of FIG. 13 provides a less complex and/or more efficient mechanism for providing appropriate voltages to the select gate and floating gate transistors of EEPROM cells 1301 and 1302. For one embodiment, the low voltage decoders may be less complex so as to generate only zero volts and positive voltages for select gates 1318 and 1306. Control logic 1304 may also supply the same voltage to each of floating gate transistors 1320 and 1308 irrespective of which EEPROM cell is selected for programming, reading, or erasing.

If EEPROM cell 1301 is selected for programming, for example, low voltage decoder 1310 may provide VPP to the gate of select transistor 1318, low voltage decoder 1312 may deselect EEPROM cell 1302 by supplying approximately zero volts to the gate of select transistor 1306, and control logic 1304 may provide programming voltage VFP to each of floating gate transistors 1320 and 1308 (source lines 1322 and 1324 may float or be grounded). Only transistor 1320 may be programmed in this configuration as select transistor 1306 may be disabled from supplying an appropriate programming voltage from bit line 1316 to the drain of floating gate transistor 1308. Similarly, if EEPROM cell 1302 is selected for programming, low voltage decoder 1312 may provide VPP to the gate of select transistor 1306, low voltage decoder 1310 may deselect EEPROM cell 1302 by supplying approximately zero volts to the gate of select transistor 1318, and control logic 1304 may provide programming voltage VFP to each of floating gate transistors 1320 and 1308 (source lines 1324 and 1322 may float or be grounded).

If EEPROM cell 1301 is selected for reading, for example, low voltage decoder 1310 may provide VR to the gate of select transistor 1318, low voltage decoder 1312 may deselect EEPROM cell 1302 by supplying approximately zero volts to the gate of select transistor 1306, and control logic 1304 may provide reading voltage VFR to each of floating gate transistors 1320 and 1308 (source lines 1322 and 1324 may have approximately zero volts). Approximately one to two volts may then be applied on bit line 1316. Only transistor 1320 may be selected for reading in this configuration as select transistor 1306 may be disabled from supplying an appropriate reading voltage from bit line 1316 to the drain of floating gate transistor 1308. Similarly, if EEPROM cell 1302 is selected for reading, low voltage decoder 1312 may provide VR to the gate of select transistor 1306, low voltage decoder 1310 may deselect EEPROM cell 1302 by supplying approximately zero volts to the gate of select transistor 1318, and control logic 1304 may provide programming voltage VFR to each of floating gate transistors 1320 and 1308. Approximately one to two volts may then be applied on bit line 1316 (source lines 1322 and 1324 may have approximately zero volts).

Floating gates 1320 and 1308 may be simultaneously erased, for example, by floating or grounding source lines 1322 and 1324, low voltage decoders 1310 and 1312 applying VE to the gates of select transistors 1318 and 1306, control logic 1304 supplying VFE to the gates of floating gate transistors 1320 and 1308, and/or applying approximately zero volts (scheme A in Table 1) or approximately −4 to −8 volts (scheme B in Table 1) to bit line 316.

Figure 14:
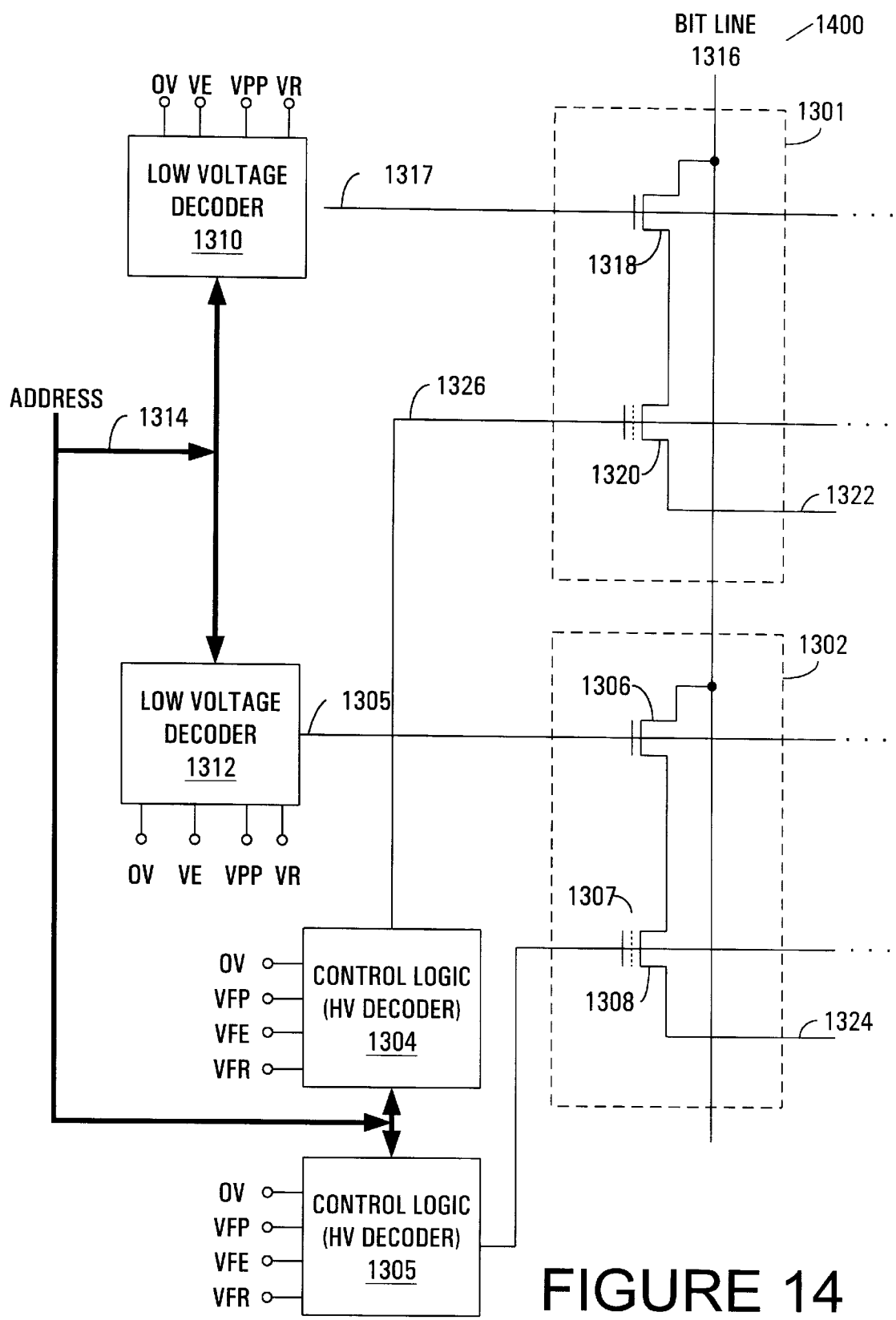
FIG. 14 is a circuit diagram of another embodiment of an EEPROM cell array including decoder circuitry according to the present invention.

FIG. 14 shows another embodiment of decoding circuitry that may be used for the EEPROM array of FIG. 13. For this embodiment, a different control logic block or high voltage decoder block may be provided for each row of EEPROM cells. Each control logic block may be coupled to the address input lines such that, together with the low voltage decoders, each row of EEPROM cells may be independently programmed and/or erased. Each control logic block may decode the address to determine the voltage that it should supply to the control gate of a selected EEPROM cell or a selected row of EEPROM cells. For example, FIG. 14 shows that control logic 1304 may control the voltages applied to the control gate of floating gate transistor 1320 (and all other cells in its row), and an additional control logic block 1305 may be added to separately control the voltages applied to the control gate of floating gate transistor 1308 (and other cells in its row) via line 1328. Line 1322 may be controlled by control logic 1304, and line 1324 may be controlled by control logic 1305. In an alternative embodiment, lines 1322 and 1324 may be controlled by other logic.

To erase a selected row of EEPROM cells, a high positive voltage VFE may be passed to the control gates of that row by the appropriate control block while all other control gates in other rows are deselected and have approximately zero volts passed to them by their respective control logic blocks. The zero or negative voltage for the inversion channel is passed either from the source lines 1322 and 1324 (which may be coupled together) or through bit line 1316, and by applying a positive voltage to the selected word line of the select transistor of the row of EEPROM cells.

To program a selected row of EEPROM cells, a program voltage of VFP may be applied to only the selected row of control gates by the appropriate control block while all other control gates in other rows are deselected and have approximately zero volts passed to their by their respective control logic blocks. Lines 1322 and 1324 may float during programming. If fewer than all of the EEPROM cells in a row are to be programmed, then the bit lines for the selected EEPROM cells in the row may be driven to approximately 3 to 5.5 volts, while the deselected EEPROM cells in the selected row may be driven to approximately zero volts. The negative control gate voltage disturb (i.e., the lowering of the erased voltage by the negative control gate voltage in the absence of a voltage on the drain of the floating gate transistor) may be small as the negative voltage is experienced only once by the selected control gate during programming. This embodiment (and the embodiment of FIG. 13) also advantageously may have minimum bit line disturb because the bit line voltage is passed to the drain of the floating gate transistor only once when that row is selected for programming.

To read from a selected cell (or row of cells), all of the control gates of the floating gate transistors in every row may be set to VFR as in the embodiment of FIG. 13. Thus, there may be approximately no delay in decoding, selecting, and applying this voltage to the selected control gate. The cell to be read is selected by the enabling the select gate transistor. Since select gate transistors may be turned off when deselected, the capacitive loading on a given bit line may be very small. The time to read a state from a selected cell may be increased given that the floating gate transistors are already biased into a read state and the low capacitance on the bit lines.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. An electrically erasable programmable read only memory (EEPROM) cell comprising:

a semiconductor substrate;

a tunnel dielectric layer formed over the substrate;

a floating gate transistor having a floating gate formed over the tunnel dielectric and a control gate formed over the floating gate; and a select transistor having a first gate formed over the tunnel dielectric, a second gate formed over the first gate, the second gate electrically connected to the first gate by a conductive layer formed over the first and second gates.

2. The EEPROM cell of claim 1, wherein the floating gate of the floating gate transistor and the first gate of the select transistor comprise a common conductive material.

3. The EEPROM cell of claim 2, wherein the common conductive material comprises polysilicon.

4. The EEPROM cell of claim 1, wherein the control gate of the floating gate transistor and the second gate of the select transistor comprise a common conductive material.

5. The EEPROM cell of claim 4, wherein the common conductive material comprises polysilicon.

6. The EEPROM cell of claim 1, wherein the floating gate transistor has a source region and a drain region in the semiconductor substrate, and wherein the select transistor further comprises a source region and a drain region in the semiconductor substrate, wherein the drain region of the floating gate transistor and the source region of the select transistor region are the same region.

7. The EEPROM cell of claim 1, wherein a source region and a drain region of the floating gate transistor are self-aligned to the floating gate and the control gate, and wherein a source region and a drain region of the select gate transistor are self-aligned to the first and second gates.

8. The EEPROM cell of claim 1, wherein the conductive layer comprises a metal layer.

9. A method of forming an electrically erasable programmable read only memory (EEPROM) cell comprising:

forming a tunnel dielectric over a semiconductor substrate;

forming a floating gate transistor over the tunnel dielectric, the floating gate transistor configured to store charge; and forming a select transistor over the tunnel dielectric, the select transistor having a first and second gate electrically connected together by a conductive layer formed over the first and second gates.

10. The method of claim 9, wherein the steps of forming the floating gate transistor and the select transistor comprise the steps of:

forming a first conductive layer over the tunnel dielectric;

forming an interlayer dielectric layer over the first conductive layer;

forming a second conductive layer over the interlayer dielectric layer; and forming a control gate and a floating gate for the floating gate transistor, and the first gate and the second gate for the select transistor.

11. The method of claim 10, wherein the steps of forming the floating gate transistor and the select transistor further comprise the step of forming source and drain regions for the floating gate transistor and the select transistor after forming the second conductive layer.

12. The method of claim 10, wherein the first conductive layer and the second conductive layer comprise polysilicon.

13. The method of claim 12, wherein the third conductive layer comprises a metal layer.

14. The method of claim 10, further comprising the step of depositing the conductive layer over the first and second conductive layers to electrically connect the first and second conductive layers.

15. A memory device comprising:

a first electrically erasable programmable read only memory (EEPROM) cell comprising:

a first select transistor overlying a tunnel dielectric layer and having select and control gates electrically coupled together by a conductive layer formed thereover and being coupled to a first word line; and a first floating gate transistor, the first floating gate transistor comprising a first control gate and a first floating gate;

a second EEPROM cell coupled to the first EEPROM cell comprising;
   a second select transistor coupled to a second independent word line; and
   a second floating gate transistor comprising a second control gate and a
second floating gate; and
circuitry coupled to the first floating gate transistor and the second floating gate transistor, the circuitry providing a common read voltage to the first and second control gates for reading data stored on the first floating gate.

16. The memory device of claim 15, wherein the first control gate and the second control gate are coupled together.

17. The memory device of claim 15, wherein the circuitry comprises a first circuit couple to the first control gate, and a second independent circuit coupled to the second control gate.

18. The memory device of claim 15, further comprising decoder circuitry coupled to the first and second select transistors.

19. The memory device of claim 15, wherein the second select transistor comprises a first gate and a second gate electrically coupled together.

20. A method of programming an electrically erasable programmable read only memory (EEPROM) cell having a select transistor coupled to a bit line and a floating gate transistor having a control gate and a floating gate, the method comprising applying a negative voltage to the control gate of the floating gate transistor, a first positive voltage to the bit line, and a second positive voltage to a gate of the select transistor.

21. The method of claim 20, further comprising the step of floating a source terminal of the floating gate transistor.

* * * * *